United States Patent
Emon et al.

(10) Patent No.: US 11,506,722 B2
(45) Date of Patent: Nov. 22, 2022

(54) ILLUMINATION DEVICE AND TEST CHAMBER

(71) Applicants: WEISS UMWELTTECHNIK GMBH, Reiskirchen (DE); CLIMATS S.A.S., St Médard d'Eyrans (FR)

(72) Inventors: Matthias Emon, Talence (FR); Christian Haack, Marburg (DE); Volker Schlosser, Gruenberg (DE); Dennis Reuschel, Giessen (DE); Ricardo Dietz, Giessen (DE)

(73) Assignee: WEISS TECHNIK GMBH, Reiskirchen (DE)

( * ) Notice: Subject to any disclaimer, the term of this patent is extended or adjusted under 35 U.S.C. 154(b) by 77 days.

(21) Appl. No.: 16/887,176

(22) Filed: May 29, 2020

(65) Prior Publication Data

US 2020/0379053 A1    Dec. 3, 2020

(30) Foreign Application Priority Data

May 31, 2019    (EP) .................................... 19177697

(51) Int. Cl.
*G01R 31/44*   (2020.01)
*H05B 47/20*   (2020.01)

(52) U.S. Cl.
CPC ............. *G01R 31/44* (2013.01); *H05B 47/20* (2020.01)

(58) Field of Classification Search
CPC .... G01R 31/44; G01R 31/56; G01R 31/2635; H05B 47/20; H05B 47/22; H05B 47/235;

(Continued)

(56) References Cited

U.S. PATENT DOCUMENTS

| 3,813,514 A | 5/1974 | Canty |
| 2004/0041984 A1 * | 3/2004 | Tani ..................... G03B 21/208 353/20 |

(Continued)

FOREIGN PATENT DOCUMENTS

| CH | 701962 A1 * | 4/2011 | ............ F21V 23/005 |
| CN | 10448284 B * | 12/2014 | |

(Continued)

OTHER PUBLICATIONS

Wikipedia contributors. "Borosilicate glass." Wikipedia, The Free Encyclopedia. Wikipedia, The Free Encyclopedia, Apr. 26, 2019. Web. Sep. 22, 2021. (Year: 2019).*

*Primary Examiner* — Daniel R Miller
*Assistant Examiner* — Eric Sebastian Von Wald
(74) *Attorney, Agent, or Firm* — Quarles & Brady LLP

(57) ABSTRACT

An illumination module for a test chamber, a test chamber and a method for modifying a test chamber. The test chamber includes a temperature-insulated test space sealable against an environment for receiving test material. The illumination module can be disposed at least partially in the test space to illuminate the test space and includes an illuminant and a socket, a wall duct and a light conducting device. The wall duct is disposed in a wall surrounding the test space and extends from an inner side to an outer side of the wall. The light conducting device has a light exit area and a light entry area and is disposed within the wall duct. The socket is disposed at the outer end positioning the illuminant at the light entry area. The light exit area is disposed at the inner end.

15 Claims, 1 Drawing Sheet

(58) Field of Classification Search
CPC ............. H05B 47/11; A47G 2200/085; G01N 17/004; G07C 2009/00785; G01J 2001/4247; G01J 1/06; G01J 1/58; G01K 2213/00; G01B 6/12028; G02B 6/4296; G10H 2220/351; H01S 5/0607
See application file for complete search history.

(56) References Cited

U.S. PATENT DOCUMENTS

| | | | |
|---|---|---|---|
| 2004/0246745 A1* | 12/2004 | Morris | G02B 5/226 |
| | | | 362/583 |
| 2008/0037280 A1* | 2/2008 | Sheng | F21S 43/237 |
| | | | 362/613 |
| 2009/0316385 A1* | 12/2009 | Weber | F21K 9/61 |
| | | | 362/310 |
| 2016/0154193 A1* | 6/2016 | Brukilacchio | G02B 19/0066 |
| | | | 385/33 |
| 2019/0093926 A1 | 3/2019 | Haack et al. | |

FOREIGN PATENT DOCUMENTS

| | | | | |
|---|---|---|---|---|
| CN | 205808550 U | * | 12/2016 | |
| EP | 0331064 A1 | | 9/1989 | |
| EP | 0446692 A1 | | 9/1991 | |
| EP | 1411338 A2 | * | 4/2004 | ............. G01M 7/06 |
| KR | 100874760 B1 | * | 12/2008 | |
| WO | 9851979 A1 | | 11/1998 | |

* cited by examiner

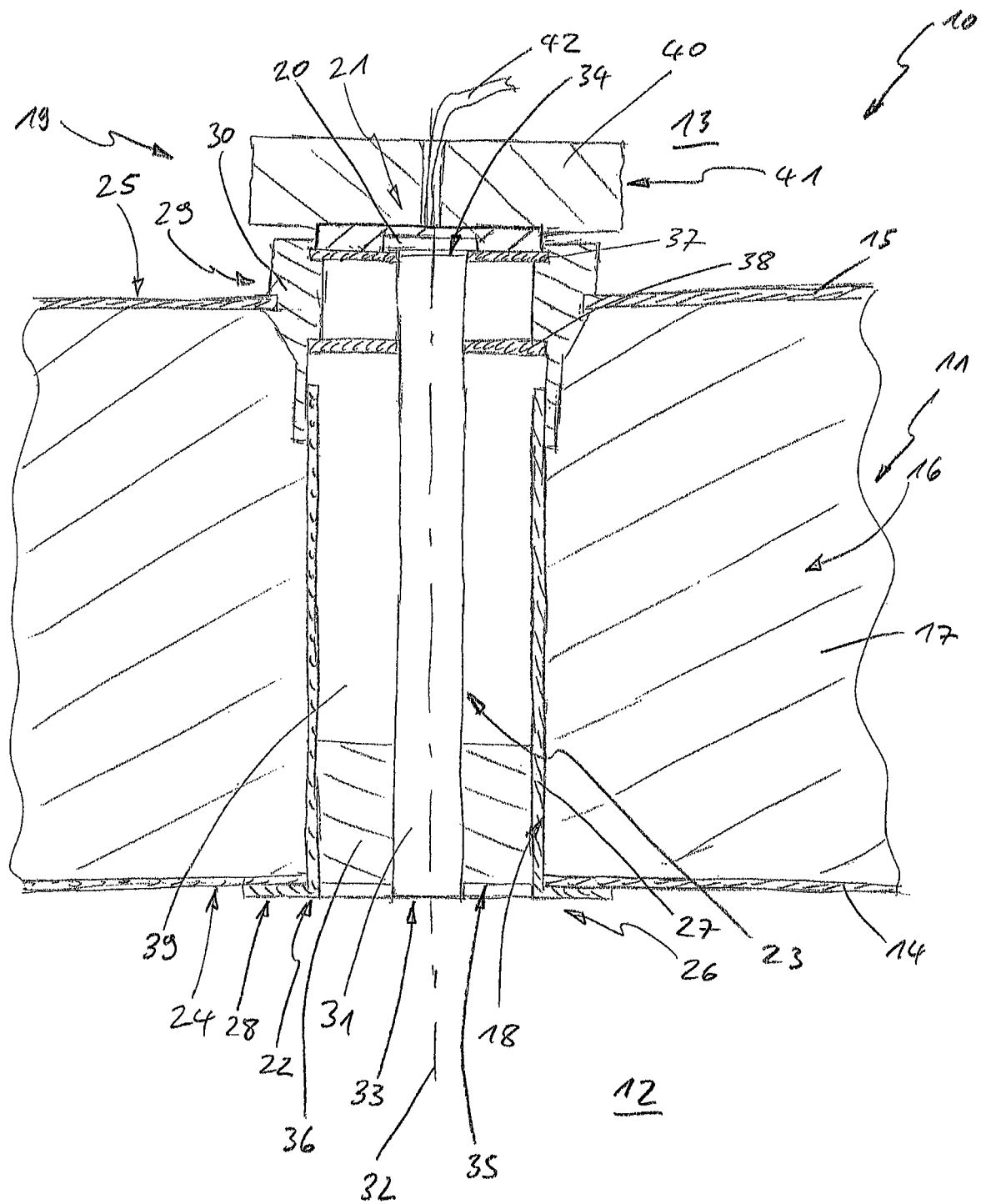

ILLUMINATION DEVICE AND TEST CHAMBER

This application claims priority to European Patent Application no. 19177697.0 filed on May 31, 2019, which is incorporated herein by reference in its entirety for all purposes.

The disclosure relates to an illumination module for a test chamber, to a test chamber having an illumination module and to a method for modifying a test chamber, the test chamber comprising a temperature-insulated test space sealable against an environment for receiving test material, a temperature ranging from −20° C. to +100° C., preferably from −60° C. to +180° C., particularly preferably from −80° C. to +300° C., being able to be produced within the test space, the illumination module being able to be disposed at least partially in the test space and the test space being able to be illuminated by the illumination module, which comprises an illuminant and a socket. The disclosure further relates to a test chamber having such an illumination module.

When testing the temperature or climate of test material, test chambers having sealable test spaces are commonly used in which at least a temperature as well as other environmental parameters can be set so as to be able to simulate certain climatic or other environmental conditions. The test material is exposed to the simulated environmental conditions during a test sequence or a test period. In order to be able to visually determine a potential change of the test material during a test sequence with, for example, gradual temperature changes, the test material within the test space must be illuminated. One or more illumination modules or lamps which are disposed within the test space and thus enable a person to monitor the test material or examine the test space commonly compose this illumination. The test space itself can have one or more windows through which a person can see into the test space. Furthermore, the illumination need not only be employed during a test sequence but also when setting up a test configuration within the test space, cleaning the test space or conducting other activities in the test space. Such a test chamber is disclosed in DE 10 2016 204 378 A1, for example.

Illumination modules or lamps are commonly disposed in such a manner within the test space on an inner side of a wall of the test space that the test space may be illuminated sufficiently. These illumination modules are essentially made of a socket having an illuminant in a lamp casing. The lamp casing is designed having a transparent shade and can be tightly sealed against an environment. This may become necessary depending on the test conditions in the test space since temperatures below freezing and over 100° C., high air humidity or fog and/or corrosive fluids, such as brine, may be realized or present. Hitherto, incandescent halogen lamps have been used as an illuminant as these are inexpensive and readily available. A disadvantage is, however, that incandescent lamps are also exposed to the temperature fluctuations in the test space and only have a short service life whilst exchanging light bulbs is time-consuming. Incandescent lamps that have a longer service life, so called oven lamps, have a very low light yield. Moreover, incandescent lamps add a thermal load within the test space which would have to be compensated by a higher performance of a temperature control device of a cooling circuit when cooling the test space. Yet using light-emitting diodes as an alternative illuminant is problematic since they can only be reliably used at a temperature of up to 80° C. Higher temperatures commonly lead to a significantly shortened service life of the light-emitting diode.

It is therefore the object of the present disclosure to propose an illumination module and a test chamber having an illumination module which both enable reliably illuminating a test space.

This object is attained by an illumination module having the features of claim 1, a test chamber having the features of claim 9 and a method for modifying a test chamber having the features of claim 15.

The illumination module according to the disclosure for a test chamber comprises an illuminant and a socket, the test chamber comprising a temperature-insulated test space sealable against an environment for receiving test material, a temperature ranging from −20° C. to +100° C., preferably from −60° C. to +180° C., particularly preferably −80° C. to +300° C., being able to be produced within the test space, the illumination module being able to be disposed at least partially in the test space and being able to be illuminated by the illumination module, which has a wall duct and a light conducting device, the wall duct being able to be disposed in a wall surrounding the test space whereby the wall duct extends from an inner side to an outer side of the wall, the light conducting device having a light exit area and a light entry area and being disposed within the wall duct whereby it extends from an inner end to an outer end of the wall duct, the socket being disposed at the outer end and the illuminant being positioned at the light entry area, the light exit area being disposed at the inner end.

Consequently, the illumination module according to the disclosure is realized such that it is not disposed on an inner side of a wall of the test space as known from the state of the art but instead passes through the wall. This is made possible by the wall duct which connects the inner side to the outer side of the temperature-insulated wall. Within the wall duct, the light conducting device is disposed at whose light entry area the illuminant is positioned. The illuminant is held or disposed at the light entry area by means of the socket which itself is fastened at the outer end of the wall duct. Light or flux of the illuminant can be coupled into the light conducting device via the light entry area and escapes from the light conducting device at the light exit area. Since the light exit area is disposed at the inner end of the wall duct, the test space can be illuminated by the escaping light.

It is essential that the illuminant is located in the area of the outer end of the wall duct. Since the illuminant is spaced apart from the test space via the light conducting device and is disposed outside of the test space, the illuminant is no longer exposed to high temperatures or temperature fluctuations. For this reason, generally all kinds of illuminants can be used for realizing the illumination module. Furthermore, the illuminant no longer induces a thermal load within the test space, which enables an advantageous operation of a cooling device of the test chamber regarding energy efficiency. At the same time, it is also possible to couple a comparatively high flux into the light conducting device to be able to illuminate the test space even better. Since the illuminant is no longer exposed to extreme temperatures, a service life of the illuminant is significantly prolonged. At the same time, the illuminant can be easily exchanged during operation of the test chamber. A volume of the test space can be enlarged by a lamp casing no longer having to be disposed in the test space.

It is advantageous if the wall duct is made of a hollow profile, preferably a tube. The tube can be round, rectangular or square. The tube can then be easily inserted into an opening in the wall which corresponds to the outer measurements of the tube. It can be further intended that the tube has a flange at one end, preferably at the inner end, by means of which the tube abuts against a side or an inner side of the wall in a sealing manner. The wall duct can comprise a further tube or a flange, either of which is connected to the tube and is realized so as to be displaceable on the tube like a telescopic slide. Moreover, the two tubes or the tube and the flange can be screwed to each other in a form-fit manner by means of a thread connection and/or be connected by adhering to each other. In this way, the wall duct can be easily adjusted to a thickness of the wall. Furthermore, a flange can be formed on the further tube so that it abuts against the outer side of the wall in a sealing manner.

The light conducting device can be rod-shaped at least in sections, the light conducting device being able to consist of glass, preferably borosilicate glass. The light conducting device can consist of a monolithic body made of glass, the light conducting device being able to comprise mirrors and prisms as well as other suitable optical elements. Borosilicate glass can be used for temperatures ranging from $-270°$ C. to $+500°$ C. and is resistant to humidity. Borosilicate glass is also resistant to highly corrosive media, such as acids and lyes.

The wall duct and the light conducting device can be coaxial with respect to one another. The illumination module can be designed essentially rotationally symmetric with regard to its longitudinal axis. Producing and mounting the illumination module becomes significantly facilitated.

A gap can be formed between the wall duct and the light conducting device. In this case, the light conducting device is thermally separated from the wall duct. For instance, the light conducting device can be disposed in the wall duct with spacers such that the gap is formed. A spacer can be realized in the manner of an annular disc, for example.

The illumination module can comprise a sealing means which can be disposed at the inner end, the light conducting device being able to pass through the sealing means and the sealing means being able to seal the light conducting device at the wall duct. The sealing means can be realized like a plug, for example, which is inserted into the wall duct at the inner end. The light conducting device can be inserted into the plug via a simple bore. The light conducting device can be essentially flush with the inner end of the wall duct or project somewhat over the inner end. The sealing means can consist of silicone or a different temperature-resistant material, for example. By realizing the sealing means as a plug, it becomes possible to compensate different temperature expansion coefficients of the wall duct, the sealing means and the light conducting device via an elasticity of the plug while simultaneously achieving a sufficient sealing effect.

The illuminant can be a light-emitting diode or a halogen lamp. A light-emitting diode has a comparatively low power consumption and a long service life. In addition, a light-emitting diode allows adjusting a light color, a flux and a color rendering as required. A voltage supply of the light-emitting diode can be integrally connected to the light-emitting diode, meaning that no external network is required for operating the illumination module. The light-emitting diode can have a standardized base which is inserted into a standardized socket. Concerning its shape, the light-emitting diode or the thus realized illuminant can consequently bear similarities to a conventional illuminant. Alternatively, the light-emitting diode can be disposed on a printed circuit board which forms the socket.

The socket can have a cooling device and electric connecting means. The cooling device can be a cooling appliance having fins formed thereon for dissipating heat to an environment. The electric connecting means can be electric supply lines which are connected to the socket.

The test chamber according to the disclosure for conditioning air comprises a temperature-insulated test space sealable against an environment for receiving test material and comprises at least one illumination module according to the disclosure. The illumination module can be flush with an inner side of a wall surrounding the test space so that no bothersome edges are yielded on the inner side of the test space. The test space is thus not unnecessarily downsized by a lamp casing. Since there is no ignition source within the test space, the test chamber can be designed in conformity with the ATEX Directive 2014/34/EU of the European Union as valid on the date of priority.

The test chamber can comprise temperature-insulated and surrounding walls in the test space, a thermal insulation material being able to be disposed between an inner side and outer side of the respective wall. For instance, the inner side of the wall can be made from a stainless-steel sheet, the insulation material being able to be disposed between the outer side of the wall, which can also be made from a stainless-steel sheet. Consequently, the insulation material can essentially fill the entire wall. A wall thickness can be >5 cm, preferably 10 cm, particularly preferably 10 cm to 20 cm or more.

The test chamber can comprise a temperature control device for controlling the temperature of the test space, a temperature ranging from $-20°$ C. to $+100°$ C., preferably from $-60°$ C. to $+180°$ C., particularly preferably from $-80°$ C. to $+300°$ C., being able to be produced within the test space by means of the temperature control device. It is thus possible to set temperatures in this range in the test space by means of the test chamber and to conduct a gradual temperature change in the scope of a test sequence, for example.

The temperature control device can comprise a cooling device having a refrigerant, a compressor, a condenser and an expansion valve in a circuit having a first heat exchanger disposed within the test space, the refrigerant being able to be supplied to the first heat exchanger, the temperature control device being able to comprise a heating device having a heater and a second heat exchanger disposed within the test space. It is thus possible to cool the test space via the first heat exchanger and to heat the test space via the second heat exchanger. The second heat exchanger can be realized by electric heating.

Furthermore, the test space can be designed to receive a corrosive liquid. A corrosive liquid can be, for example, an acid or a lye. It is essential, therefore, that an inner side of a wall of the test space is designed such at the least that it is resistant to the corrosive liquid. The inner side can also be resistant to corrosion by a corresponding coating, for example.

The test chamber can comprise a control device for setting a test condition by controlling and/or regulating an air temperature, an air pressure and a relative air humidity in the test space. Using the control device, it is then possible to control a test sequence. At the same time, the illumination module(s) can be switched on and off via the control device.

For the method according to the disclosure for modifying a test chamber having a temperature-insulated test space sealable against an environment for receiving test material, a lamp which has a lamp casing and is disposed within the test space on an inner side of the temperature-insulated wall of the test chamber, which surrounds the test space, is removed, a through bore extending from an outer side of the wall to an inner side being formed in the wall, an illumination module having a wall duct, a light conducting device, an illuminant and a socket being inserted into the through bore in such a manner that the wall duct extends from the inner side to the outer side of the wall, the light conducting device comprising a light exit area and a light entry area and being disposed within the wall duct by extending from an inner end to an outer end of the wall duct, the socket being disposed at the outer end and positioning the illuminant at the light entry area, the light exit area being disposed at the inner end.

The description of advantages of the illumination module according to the disclosure and the test chamber according to the disclosure is referred to regarding the advantages of the method according to the disclosure. Further advantageous embodiments of the method can be derived from the description of features of the dependent claims referring back to device claim 1.

The FIGURE shows a longitudinal cut of an illumination module 10 in a wall 11 (illustrated in sections) of a test chamber (not further visible). Wall 11 surrounds a test space 12 and tightly seals it against an environment 13. Wall 11 is made of sheets 14 and 15 which are essentially disposed parallel relative to one another and form a gap 16 filled with an insulation material 17 for temperature insulation. A through bore 18 is formed in wall 11 into which illumination module 10 is inserted. Illumination module 10 comprises a socket 19 having an illuminant 21 realized as a light-emitting diode 20, a wall duct 22 and a light conducting device 23. Wall duct 22 extends from an inner side 24 to an outer side 25 of wall 11. A flange 28 is formed in particular on the inner side 24 or rather at an inner end 26 of a tube 27 of wall duct 22 and abuts tightly against inner side 24. An annular flange 30 of wall duct 22 is fastened to outer side 25 at an outer end 29 of wall duct 22. Wall duct 22 can be adjusted to a thickness of wall 11 due to tube 27 being able to be moved like a telescope within flange 30. Tube 27 can be connected to flange 30 via a thread (not illustrated), by stretching and/or adhering thereto.

The light conducting device 23, which is realized by a glass rod 31 in this instance, is disposed within wall duct 22. Glass rod 31 is disposed coaxially relative to tube 27 or flange 30 in the direction of a longitudinal axis 32 of illumination module 10 and realizes a light exit area 33 and a light entry area 34. Furthermore, illumination module 10 comprises a sealing device 10 realized as a plug 36. Glass rod 31 passes through plug 36 so that the light exit area 33 abuts against inner end 26 in test space 12. Furthermore, glass rod 31 is retained in wall duct 22 by annular discs 37 and 38. A gap 39 is thus formed between wall duct 22 and glass rod 31. Socket 19 is disposed at outer end 29 and receives light-emitting diode 20. Cooling fins 40 of a cooling device 41 of socket 19 are formed on socket 19 and cables 42 are guided to light-emitting diode 20. Light emitted by light-emitting diode 20 enters light entry area 34 of glass rod 31 and exits from light exit area 33 into test space 12 so that test space 12 is illuminated. Heat emitted by light-emitting diode 20 can be dissipated to environment 13 via cooling device 41. Since light-emitting diode 20 is spaced far apart from test space 12 via glass rod 31 and light-emitting diode 20 is not significantly impacted by existing temperatures and environment conditions due to gap 39 and insulation material 17, it only then becomes possible to use light-emitting diode 20 with a comparatively long service life.

The invention claimed is:

1. A test chamber for conditioning air comprising a temperature-insulated test space sealable against an environment for receiving test material, a temperature ranging from −80° C. to +300° C., being able to be produced within the test space, the test chamber including an illumination module being able to be disposed at least partially in the test space and the test space being able to be illuminated by the illumination module, which comprises an illuminant and a socket, wherein the illumination module comprises a wall duct made of a hollow tube and a light conducting device, the wall duct being disposed in a wall surrounding the test space whereby the wall duct extends from an inner side to an outer side of the wall, the light conducting device having a light exit area and a light entry area and being disposed within the wall duct whereby it extends from an inner end to an outer end of the wall duct, the socket being disposed at the outer end and positioning the illuminant at the light entry area, the light exit area being disposed at the inner end, wherein a gap is formed between the wall duct and the light conducting device and wherein the illumination module comprises a sealing device which is disposed at the inner end, the light conducting device passing through the sealing device and the sealing device bridges the gap between the wall duct and the light conducting device, sealing the light conducting device at the wall duct.

2. The test chamber according to claim 1, wherein the wall duct is made of a hollow profile.

3. The test chamber according to claim 1, wherein the light conducting device is rod-shaped at least in sections, the light conducting device consisting of glass.

4. The test chamber according to claim 1, wherein the wall duct and the light conducting device are coaxial with respect to one another.

5. The test chamber according to claim 1, wherein the illuminant is a light-emitting diode or a halogen lamp.

6. The test chamber according to claim 1, wherein the socket has a cooling device and electric connecting means.

7. The test chamber according to claim 1, wherein the test chamber comprises temperature-insulated walls surrounding the test space, a thermal insulation material being disposed between an inner side and an outer side of the walls.

8. The test chamber according to claim 1, wherein the test chamber comprises a temperature control device for controlling the temperature of the test space, the temperature ranging from −20° C. to +100° C. being able to be produced within the test space by means of the temperature control device.

9. The test chamber according to claim 8, wherein the temperature control device comprises a cooling device having a refrigerant, a compressor, a condenser and an expansion valve in a circuit having a first heat exchanger disposed within the test space, the refrigerant being able to be supplied to the first heat exchanger, the temperature control device comprising a heating device having a heater and a second heat exchanger disposed within the test space.

10. The test chamber according to claim 1, wherein the test space is designed to receive a corrosive fluid.

11. The test chamber according to claim 1, wherein the test chamber comprises a control device for setting a test condition by controlling and/or regulating an air temperature, an air pressure and a relative air humidity in the test space.

12. The illumination module according to claim 1, wherein the temperature ranges from −20° C. to +100° C.

13. The illumination module according to claim 1, wherein the temperature ranges from −60° C. to +180° C.

14. The illumination module according to claim 1, wherein the light conducting device consists of borosilicate glass.

15. A method for modifying a test chamber having a temperature-insulated test space sealable against an environment for receiving test material, a temperature ranging from −80° C. to +300° C. being able to be produced within the test space, a lamp which has a lamp casing and is disposed within the test space on an inner side of a temperature-insulated wall of the test chamber, which surrounds the test space, being removed, a through bore being formed between an outer side of the wall and the inner side, an illumination module comprising a wall duct made of a hollow tube, a light conducting device, an illuminant and a socket being inserted into the through bore in such a manner that the wall duct extends from the inner side to the outer side of the wall, the light conducting device having a light exit area and a light entry area and being disposed within the wall duct whereby it extends from an inner end to an outer end of the wall duct, the socket being disposed at the outer end and positioning the illuminant at the light entry area, the light exit area being disposed at the inner end, wherein a gap is formed between the wall duct and the light conducting device and wherein the illumination module comprises a sealing device which is disposed at the inner end and bridges the gap between the wall duct and the light conducting device, the light conducting device passing through the sealing device and the sealing device sealing the light conducting device at the wall duct.

\* \* \* \* \*

UNITED STATES PATENT AND TRADEMARK OFFICE
CERTIFICATE OF CORRECTION

PATENT NO. : 11,506,722 B2
APPLICATION NO. : 16/887176
DATED : November 22, 2022
INVENTOR(S) : Matthias Emon et al.

It is certified that error appears in the above-identified patent and that said Letters Patent is hereby corrected as shown below:

In the Claims

Claim 1, Column 6, Line 6, "alight" should be --a light--.

Claim 1, Column 6, Line 9, "alight" should be --a light--.

Signed and Sealed this
Thirty-first Day of January, 2023

Katherine Kelly Vidal
*Director of the United States Patent and Trademark Office*